United States Patent [19]
Fischer et al.

[11] Patent Number: 6,011,733
[45] Date of Patent: Jan. 4, 2000

[54] ADAPTIVE ADDRESSABLE CIRCUIT REDUNDANCY METHOD AND APPARATUS

[75] Inventors: Frederick Harrison Fischer, Macungie; Vladimir Sindalovsky, Perkasie; Scott A. Segan, South Whitehall Township, all of Pa.

[73] Assignee: Lucent Technologies Inc., Murray Hill, N.J.

[21] Appl. No.: 09/030,870

[22] Filed: Feb. 26, 1998

[51] Int. Cl.$^7$ .................................................. G11C 7/00
[52] U.S. Cl. .......................................... 365/200; 365/201
[58] Field of Search ..................................... 365/200, 201

[56] References Cited

U.S. PATENT DOCUMENTS

| | | | |
|---|---|---|---|
| 4,380,066 | 4/1983 | Spencer et al. | 371/10 |
| 4,739,498 | 4/1988 | Eichhorn | 365/200 |
| 5,058,059 | 10/1991 | Matsuo et al. | 365/96 |
| 5,058,070 | 10/1991 | Faber et al. | 365/200 |
| 5,153,880 | 10/1992 | Owen et al. | 365/200 |
| 5,204,836 | 4/1993 | Reed | 365/200 |
| 5,224,073 | 6/1993 | Nakayama | 365/200 |
| 5,255,234 | 10/1993 | Seok | 365/222 |
| 5,257,228 | 10/1993 | Sukegawa | 365/200 |
| 5,313,424 | 5/1994 | Adams et al. | 365/200 |
| 5,383,156 | 1/1995 | Komatsu | 365/200 |
| 5,390,149 | 2/1995 | Vogley et al. | 365/189.01 |
| 5,392,246 | 2/1995 | Akiyama et al. | 365/200 |
| 5,396,124 | 3/1995 | Sawada et al. | 365/200 |
| 5,416,740 | 5/1995 | Fujita et al. | 365/200 |
| 5,420,824 | 5/1995 | Kajimoto et al. | 365/230.01 |
| 5,469,390 | 11/1995 | Sasaki et al. | 365/200 |
| 5,485,425 | 1/1996 | Iwai et al. | 365/200 |
| 5,513,144 | 4/1996 | O'Toole | 365/200 |
| 5,548,555 | 8/1996 | Lee et al. | 365/200 |
| 5,644,699 | 7/1997 | Yoshida | 395/182.05 |
| 5,675,543 | 10/1997 | Rieger | 365/200 |
| 5,696,723 | 12/1997 | Tukahara | 365/200 |
| 5,877,986 | 3/1999 | Harari et al. | 365/185.33 |

*Primary Examiner*—David Nelms
*Assistant Examiner*—M. Tran

[57] ABSTRACT

An adaptive addressable circuit redundancy method and apparatus, e.g., an adaptive memory redundancy method and apparatus, utilizes an on-chip processor to test, analyze and reassign spare addressable circuits to replace defective or intermittent addressable circuits. The present invention is applicable both in a manufacturing environment and/or in a field environment wherein the integrated circuit is operational. An adaptive addressable circuit redundancy module intercepts a data path between the on-chip processor and the addressable circuits to reassign defective addresses as necessary to utilize a spare addressable circuit bank. In another embodiment of the present invention, a broadcast write module cuts memory test time almost in half by writing a same data pattern to a significant portion or all of the addressable circuits, e.g., memory, substantially simultaneously.

43 Claims, 4 Drawing Sheets

ADAPTIVE ADDRESSABLE CIRCUIT REDUNDANCY METHOD AND APPARATUS

BACKGROUND OF THE INVENTION

1. Field of the Invention

This invention relates to an adaptive memory redundancy method and apparatus for integrated circuits having an on-chip processor and embedded memory. More particularly, it relates to a method and apparatus to adaptively replace defective memory in a device including an on-chip processor and embedded memory.

2. Background of Related Art

Many integrated circuits today include a processor and large amounts of embedded memory. It is typically difficult to manufacture such devices to have all words of memory operable. Oftentimes, certain bits of memory are defectively manufactured. However, instead of discarding the integrated circuit, memory redundancy techniques have been conventionally implemented which replace portions of the embedded memory containing defective bits so as to make the device acceptable for use. Thus, conventional memory redundancy techniques generally improve manufacturing yield.

In conventional memory redundancy techniques, extra rows, columns or blocks of memory are manufactured along with the required rows and columns of memory. If any one row, column or block of memory contains a defective memory cell, the entire row, column or block is eliminated, typically by laser etching a fuseable link to permanently modify the device circuit. The laser etching is a permanent fix based on the pre-installation test and analysis of the device, usually performed during a wafer test phase of the manufacturing process.

While being a well established method of memory redundancy, the conventional methods suffer from increased costs of manufacture due to the additional equipment, test time and process modifications required to test, locate and replace defective memory cells.

There is a need for a more efficient, cost effective and reliable approach to correct defects in memory circuits. There is also a need to adaptively correct or overcome defects in embedded memory circuits which occur even after device manufacture.

SUMMARY OF THE INVENTION

In accordance with the principles of the present invention, an adaptive addressable circuit redundancy apparatus comprises, on a single integrated circuit, a processor and a plurality of addressable circuits. A plurality of spare addressable circuits are also provided, as is an adaptive addressable circuit redundancy module which intercepts a data path between the processor and the addressable circuits. The adaptive addressable circuit redundancy module comprises an address compare circuit adapted to compare an address from the processor with assigned addresses of the spare addressable circuits and to redirect access by the processor to a matching spare element location assigned one of the spare addressable circuits.

A method of redirecting access by an on-chip processor from a defective addressable circuit to a spare addressable circuit is also provided in accordance with the present invention. According to the method, a processor and a plurality of addressable circuits are provided on an integrated circuit. At least one spare addressable circuit corresponding to any one of the addressable circuits is also provided on the integrated circuit. The on-chip processor tests an operational condition of the addressable circuits. Also, an address of at least one of the addressable circuits not meeting a minimum operational condition is reassigned to at least one of the spare addressable circuits.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides an improved redundancy method and apparatus which is particularly useful for large integrated circuits which include both an on-chip processor (e.g., a microprocessor, a microcontroller, or a digital signal processor (DSP)) and a significant amount of embedded addressable circuitry, e.g., random access memory (RAM) or read only memory (ROM).

While the present invention is described with respect to addressable embedded memory, the present invention is equally applicable to the replacement of any defective addressable circuitry which is made redundant to spare addressable circuitry.

The present embodiment of redundant memory presumes that a dominant memory failure mechanism is the failure of single bits or words of memory. This presumption is determined to be accurate based on an analysis of memory test/defect data. It is recognized by the present inventors that at least some of these single bit failures occur well after manufacture and packaging of the integrated circuit, making conventional memory redundancy methods even less appropriate. It has also been determined that the replacement of single bit memory defects will significantly increase the memory yield and overall chip yield.

Single bit defects can be overcome efficiently (both in terms of area and speed) in word organized memories by word replacement. Even over time as a device process matures and the corresponding defect density (i.e., the number of defective memory bits with respect to the overall number of memory bits) decreases, it is recognized that the availability of even just a few spare memory words will improve chip yield substantially at the time of manufacture, and increase the useful life of the device substantially when made available for adaptive use, e.g., after the integrated circuit device is installed and in the field.

The present invention provides an adaptive addressable circuit redundancy method and apparatus in an integrated circuit which uses a memory address snoop/compare circuit, and a resident processor to perform test, analysis and spare addressable circuit assignment, e.g., either in an integrated circuit during manufacture or in an operational integrated circuit in the field. The adaptive addressable circuit redundancy method and apparatus in accordance with the present invention improves device yield during testing phases (e.g., during wafer preparation and during device packaging) of the manufacturing process. The adaptive memory redundancy technique of the present invention is adaptive in the sense that it self-corrects for some memory defects which occur in embedded memory, even after the integrated circuit is installed in a larger device. The adaptive aspect of the present invention leads to an improvement in long term reliability and operational life via self-test and self-replacement of defective memory cells in the device in the field.

Figure 1:
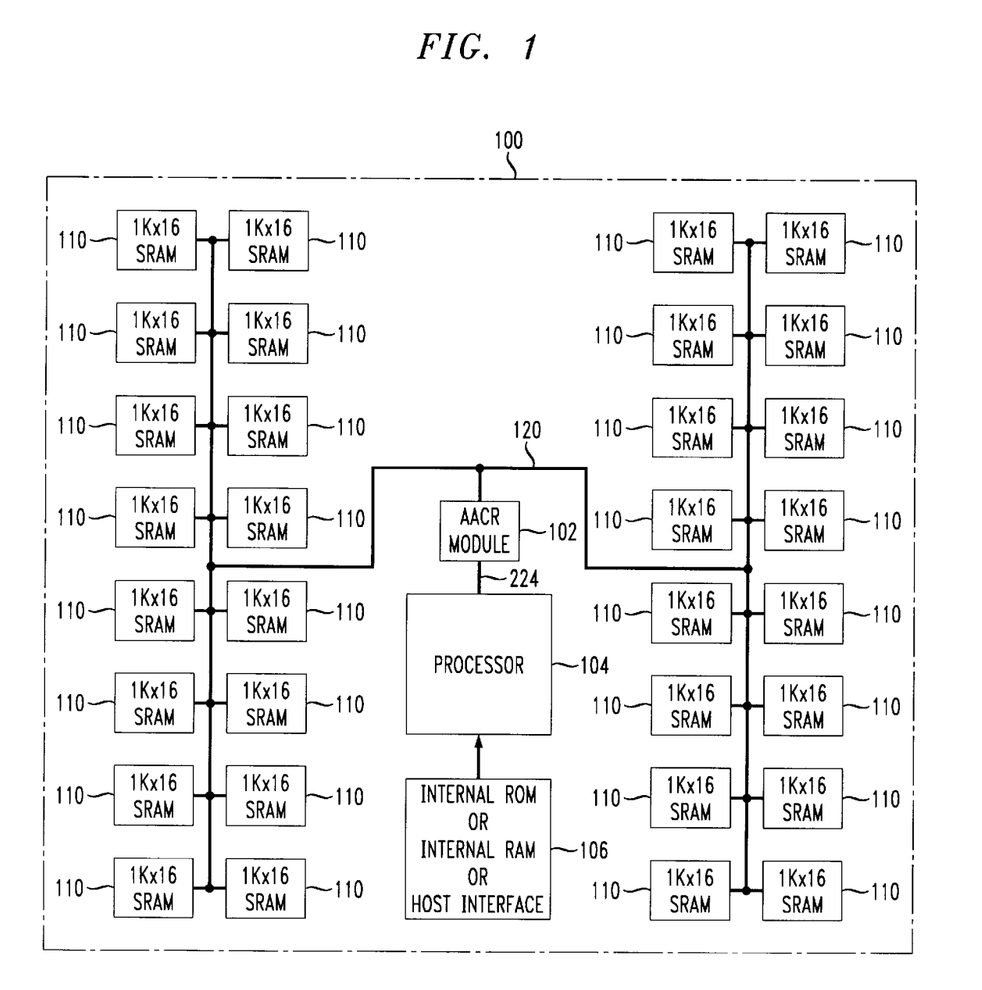
FIG. 1 is a block diagram of the relevant portions of an integrated circuit with an on-chip processor, embedded memory and an addressable circuit redundancy module in accordance with the principles of the present invention.
Figure 2:
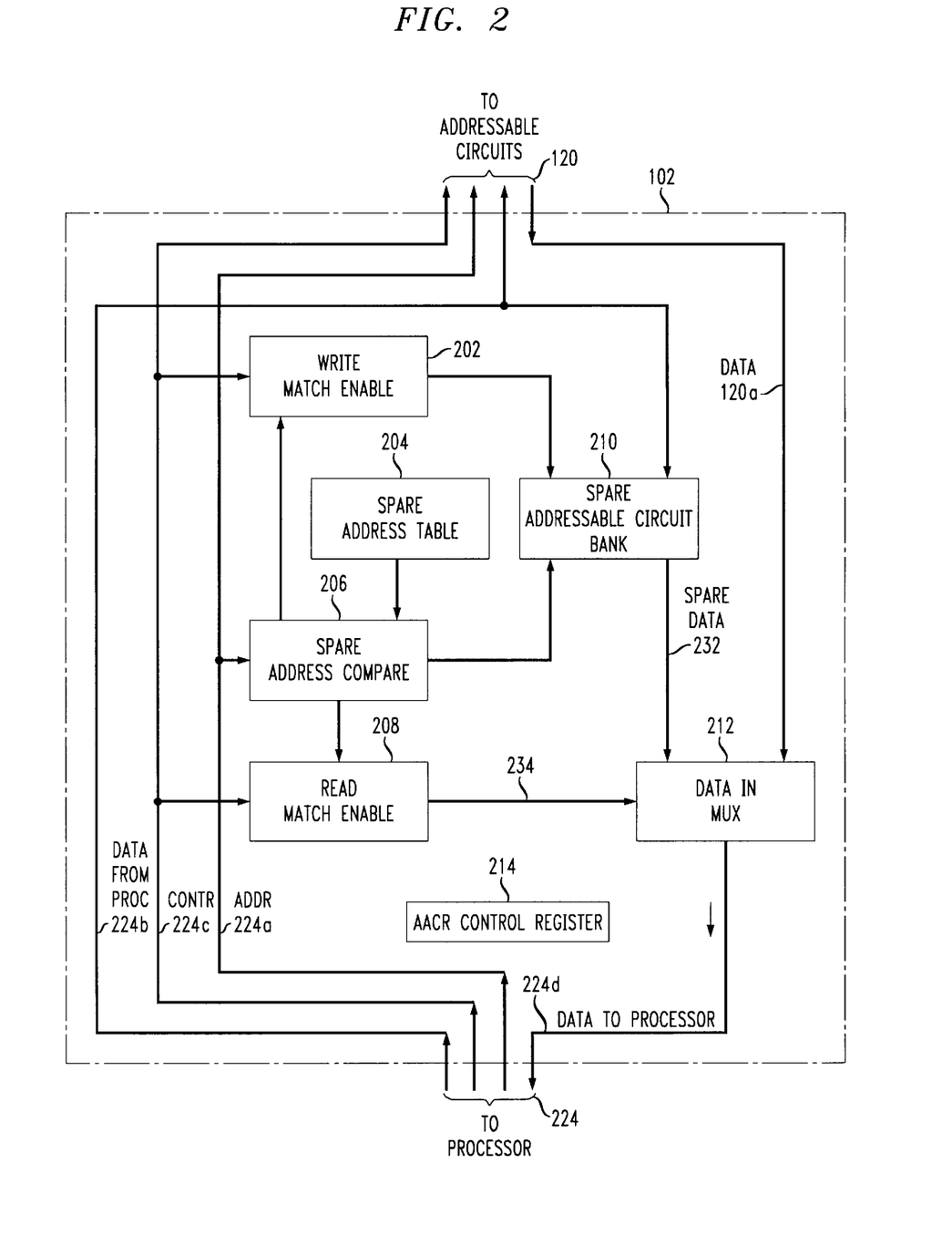
FIG. 2 is a block diagram of a first embodiment of the adaptive addressable circuit redundancy module shown in FIG. 1.

FIG. 1 shows an integrated circuit 100 including an existing on-chip processor 104, embedded addressable circuitry, e.g., addressable memory in memory blocks 110, an adaptive addressable circuit redundancy module 102, and an implementation module 106, and FIG. 2 shows one embodiment of the adaptive addressable circuit redundancy module 102 in accordance with the principles of the present invention.

In the disclosed embodiments, the integrated circuit 100 includes a processor 104 such as a digital signal processor (DSP) Model DSP 1600 commercially available from LUCENT TECHNOLOGIES INC. The processor 104, while being a DSP in the disclosed embodiment, may be any suitable on-chip processing element such as a microprocessor, microcontroller, or DSP. The processor 104 may perform a test of the addressable circuits, e.g., memory blocks 110, analysis, and/or reassignment of defectively operating addressable circuits, either at power up, upon a hard reset, soft reset, and/or on demand via software control.

The integrated circuit 100 further includes embedded memory blocks 110. The embedded memory blocks 110 in the disclosed embodiment are configured as 32 blocks of 1K×16 bit static random access memory (SRAM). Each word in the embedded memory blocks 110 is 16-bits in length, although the present invention is equally applicable to any appropriate word length memory configuration. Other memory types (e.g., read only memory (ROM), flash memory, dynamic random access memory (DRAM), etc.), other memory configurations, other memory lengths, and/or other memory word lengths other than those shown with respect to the disclosed embodiment may be implemented within the principles of the present invention.

It is to be understood by those of ordinary skill in the art that integrated circuits with any number of addressable circuits, e.g., memory blocks, and of any length or data width, are equally applicable to the principles of the present invention. The specific addressable redundant circuits, e.g., memory type, size and/or structure are used for exemplary purposes only, not to show the only possible addressable circuits which may utilize the adaptive redundancy method and apparatus in accordance with the present invention.

The embedded memory blocks 110 are dedicated to the processor 104 in the disclosed embodiment, although other processors (not shown) can be implemented on the same integrated circuit utilizing the same or separate embedded memory blocks 110. The processor 104 communicates with the embedded memory blocks 110 over suitable address, data and control busses, referred to collectively herein as memory interface 120.

The adaptive addressable circuit redundancy (AACR) module 102 contains circuitry necessary to implement AACR on the integrated circuit 100. For instance, the AACR module 102 contains the snoop and spare word circuitry used to substitute defective addressable circuits, e.g., defective memory words in the memory blocks 110, with spare addressable circuits, e.g., spare memory words. The AACR module 102 functions in cooperation with software operating the on-chip processor 104 which tests the memory blocks 110, analyzes the test results, and assigns and enables spare memory words to adaptively implement addressable circuit redundancy in accordance with the principles of the present invention.

The on-chip processor 104 and AACR module 102 interface to the applicable addressable circuits, e.g., memory blocks 110 through a memory interface 120, which includes an address bus, a data bus, and a control bus.

Implementation module 106 stores, facilitates and/or downloads the memory test, analysis and redundant circuit assignment software for use by the on-chip processor 104. In the disclosed embodiment, the implementation module 106 may include ROM, RAM, and/or a serial or parallel interface for accepting downloaded software routines for storage in the implementation module 106 or other memory area in the integrated circuit 100.

The implementation module 106 may also maintain a log of defective addresses to provide statistical or other analysis information from the integrated circuit 100 to an external device, e.g., so as to provide a means to monitor device operation, degradation and failure rate, and/or overall reliability, both currently and as projected over time as the integrated circuit is used in the field.

The adaptive addressable circuit redundancy method and apparatus of the present invention utilizes a predetermined number of spare addressable circuits, e.g., words of memory, to replace any defective address, either determined during manufacture or in the field. In the disclosed embodiment, the adaptive addressable circuit redundancy (AACR) module 102 contains the appropriate circuitry to provide eight spare words of memory (e.g., 16-bits in length each). It is to be understood that more or fewer spare words of memory may be implemented in the AACR module 102 within the principles of the present invention. Eight spare words were chosen in the disclosed embodiment as a balance between increased space and power consumption versus the increased manufacturability and reliability afforded by the amount of available spare words of memory. Nevertheless, any number of spare words of memory may be implemented, from just a few spare words to entire blocks or more of spare memory.

In the disclosed embodiment shown in FIG. 1, the AACR module 102 is used specifically to perform functions required for implementing the adaptive addressable circuit redundancy technique in accordance with the principles of the present invention. However, the memory blocks 110, the on-chip processor 104, and the implementation module 106 are "shared" with non-redundancy related functions, i.e., they perform redundancy functions in addition to their respective conventional functions. Of course, dedicated devices to implement the redundancy method in accordance with the present invention are within the scope of the present invention.

According to the inventive method and apparatus, the on-chip processor 104 is programmed to run a test of the memory blocks 110 and to determine the identity (i.e., the address) of defective memory words contained within the memory blocks 110, preferably upon power up or after a hard reset. The on-chip processor 104 assembles a composite logical address bit map in the AACR module 102 from a set of tests which check the functionality of each addressable circuit, e.g., each memory word in the memory blocks 110.

The addressable circuit test determines a condition of the memory words contained in the memory blocks 110. For instance, the memory test may determine, for each of the words in the applicable memory blocks 110, if that word is: (a) prime, meaning that all words in the applicable memory blocks 110 operate properly; (b) defective, meaning that the memory blocks 110 contain too many defective words, i.e., beyond spare coverage; or (c) defective but repairable, meaning that the memory blocks 110 contain defective words, but fewer than a desired maximum number of defective memory words. The particular memory test implemented is not necessarily important, and is typically determined based on the application. For instance, military or space applications may require exhaustive testing, e.g., '9N' testing, while commercial applications may require less exhaustive testing, e.g., '5N' testing.

If the integrated circuit 100 is classified as prime during initial manufacture, i.e., having no defective addressable circuits, e.g., words in the applicable memory blocks 110, then any further testing on the device is completed and the device is packaged and/or operated accordingly. If the integrated circuit 100 is considered defective, then typically further manufacture testing or operation is ceased. If the integrated circuit 100 is considered defective but repairable, then the on-chip processor 104 provides the address of each defective addressable circuit to a spare address table in the AACR module 102.

The spare addressable circuits may be enabled in any conventional manner. For instance, in the disclosed embodiment, the spare memory words in the AACR module 102 are enabled by a logic high or '1' written to the 16th or most significant bit (MSB) of the address of the spare word. After the spare address has been written into the appropriate register in the spare address table 204 and the redundancy enable bit has been set in the AACR control register 214, each read and write to the applicable addressable circuit, e.g., word in memory blocks 110 causes the address bus 224a to be "snooped" for a match with the entries in the spare address table 204.

In the disclosed embodiment, the spare address and memory values stored in the AACR module 102 remain undisturbed so long as the integrated circuit 100 remains powered. Thus, a soft reset, i.e., powered reset of the integrated circuit 100 does not influence the spare address and memory values. The spare addressable circuits in the AACR module 102 may be disabled as a default condition by, e.g., clearing associated register values in the AACR control register 214 upon a hard reset, and the addressable circuit test, analysis and replacement operations can be re-performed upon the hard reset. Thus, a hard reset or a power-up reset of the integrated circuit 100 can cause the adaptive addressable circuit redundancy method and apparatus according to the disclosed embodiment to restart by performing the addressable circuit test, analysis and replacement operations to establish entries in the spare address table 204 and spare addressable circuit 210.

Non-volatile memory can be used in the AACR module 102 to retain the addresses of defective words in the spare address table 204 during power-down conditions. Alternatively, the defective word address data can be stored in non-volatile RAM of an external host processor after the initial power-up and initialization sequence of the integrated circuit 100. In this case, subsequent hard resets may be followed up by a few writes to the spare address table 204 to restore (or compare) the previous on-chip redundancy information (e.g., the defective word address) retained in the AACR module 102. The defective word address may alternatively be stored in volatile memory, in which case the memory test, analysis and replacement operations should be performed after each power up.

A log of defective word address data may be maintained in the AACR module 102, preferably in non-volatile memory such as an electrically erasable read only memory or flash memory, to provide historical information about the memory blocks 110. The log may be used by the on-chip processor 104 to locate and isolate intermittently defective words in the applicable memory blocks 110. The log may also be used to provide reliability information, e.g., to an external processor. For instance, the rate at which spare memory words become used may indicate a deteriorating condition and a lessened reliability of the integrated circuit 100 for future operation. This advance reliability information can be used to predict a future failure of an integrated circuit and thus allow measures to be taken to prevent the anticipated failure before it occurs, e.g., before the number of defective word addresses exceeds the number of available spare words. The log may alternatively be stored in external memory.

One example of an AACR module 102 in accordance with the principles of the present invention is shown in FIG. 2. The AACR module 102 may be a small, centrally located block in the integrated circuit 100 through which substantially all signals related to the applicable memory blocks 110 are routed between the processor 104 and the memory blocks 110. The AACR module 102 invisibly intercepts a data path between the addressable circuits, e.g., memory blocks 110 and the processor 104 to replace defective addressable circuits, e.g., memory words in the memory blocks 110 with spare addressable circuits, e.g., memory words contained in the AACR module 102.

In particular, the AACR module 102 includes a spare address table 204 and spare addressable circuitry, e.g., spare memory 210. In the disclosed embodiment, there is a one-to-one correspondence between each spare word in the spare addressable circuits 210 and a corresponding assignable address in the spare address table 204. Thus, both the spare address table 204 and the spare memory 210 have an equal length.

The spare address table 204 may be a set of registers with each register bit output tied to the input of a comparison circuit, e.g., an XNOR gate or other combinatorial logic which is used to compare the spare addresses to the current address on the address bus 224a.

The spare addressable circuit bank 210, e.g., spare memory, may be a set of registers which have tri-state drivers tied to their outputs. As appropriate, each word in spare memory 210 is assignable by an appropriate write to an available corresponding address in the spare address table 204 by the processor 104 to replace a defective word in the memory blocks 110.

As discussed previously, a logic high or '1' in the MSB of the address enables the respective spare addressable circuit, e.g., memory word for the assigned address. The AACR control register 214 is accessed by the processor 104 and/or by a processor external to the integrated circuit 100. The spare address table 204 and/or the AACR control register 214 may reside in processor and/or input/output (I/O) space.

The adaptive memory redundancy method and apparatus of the present invention are applicable to manufacturing test as well as to later testing in the field after manufacture. Thus, it is preferred that at least some of the spare words in spare memory 210 be left unassigned during the manufacturing process to allow for adaptivity to latent defects which occur in the field. It is possible to have varying degrees of quality in the manufacturing devices based on the number of utilized or available spare addressable circuits after manufacture. Thus, by leaving at least some of the spare addressable circuits, e.g., memory words in the spare addressable circuits 210 unassigned after manufacture, latent defects which show up in the field can also be accommodated.

The AACR module 102 shown in FIG. 2 further includes an address comparison module 206 to snoop the address bus 224a and compare all addresses with those stored in the spare address table 204. If the current address on the address bus 224a matches an assigned entry in the spare address table 204, then either a write match enable 202 or read match enable 208 is activated, depending upon whether the address on the address bus 224a corresponds to a write or read command as determined by read rd and/or write wr control signals on the control bus 224c. The write match enable 202 and read match enable 208 are qualified by the read rd and/or write wr control signals on the control bus 224c (which may be combined into a single signal in some systems), and the enable bit in the AACR control register 214 for the spare, i.e., redundant memory in the spare addressable circuit bank 210.

If the matched address is a write operation from the processor 104, the data word on the data bus 224b is written to the appropriate location in the spare addressable circuit bank 210. If the matched address is a read operation, the appropriate word in the spare addressable circuit bank 210 is output from the spare addressable circuit bank 210 on spare data bus 232 to a first input of a data multiplexer (MUX) 212. Substantially simultaneously or before, the read match enable 208 switches the output of the data MUX 212 from its otherwise normal position of allowing the data bus 120a to output data to data bus 224d, to a new position passing the data from the spare addressable circuit bank 210 onto the data bus 224d.

In particular, in the disclosed embodiment, each spare address bit in the spare address table 204 is compared by a bitwise comparison, e.g., an exclusive NOR (XNOR) with the corresponding address bit on the address bus 224a. All of the compare bits in a given spare address word are compared and ANDed with an enable bit in the spare address table 204 (along with the spare enable bit from the AACR control register 214 and the memory read control signal rd on the control bus 224c from the processor 104) to form a data mux select signal 234 which determines the source of data to the processor 104, i.e., either from the spare addressable circuit bank 210 (associated with the selected spare address in the spare address table 204) or from the standard addressable circuits, e.g., memory blocks 110. In the case of writes, the data on data bus 224b will be sent to both the memory blocks 110 and to the spare memory 210. If the spare address compare 206 results in a match with an assigned address in the spare address table 204 and the appropriate enable bit is set in the AACR control register 214, then the written data on data bus 224 will be stored appropriately in the spare addressable circuit, e.g., memory 210 (and also by the appropriate address in the memory blocks 110, albeit defectively).

The software utilized by the processor 104 in a manufacturing test phase may be the same or similar to that used by the processor 104 after manufacture of the integrated circuit 100. Using the existing on-chip processor core(s) to perform test, analysis and replacement enables one to take advantage of the flexibility afforded by software programmability by sharing the functionality of an existing on-chip processor. The method and apparatus addresses the improvement of both device yield and reliability, and can be used in a variety of integrated circuit architectures, e.g., layered main/cache memory systems, various types of processors, etc. Moreover, it offers flexibility and ease of use with automated circuit generators, e.g., memory blocks, because the embedded memory blocks 110 do not have to be modified to include spare circuitry. Spare coverage is efficient and universal within the integrated circuit because, e.g., it is not restricted to a certain number of spares per block.

Furthermore, the adaptive redundancy method and apparatus allows the inclusion of results acquired from previous test sequences to be included in a spare replacement table to capture, e.g., an intermittently defective bit or word.

The adaptive memory redundancy technique in accordance with the present invention may also be used by a component manufacturer during a manufacturing phase and then made invisible to a user of the integrated circuit. Alternatively, the AACR module 102 may be made available to both the manufacturer and the user.

Figure 3:
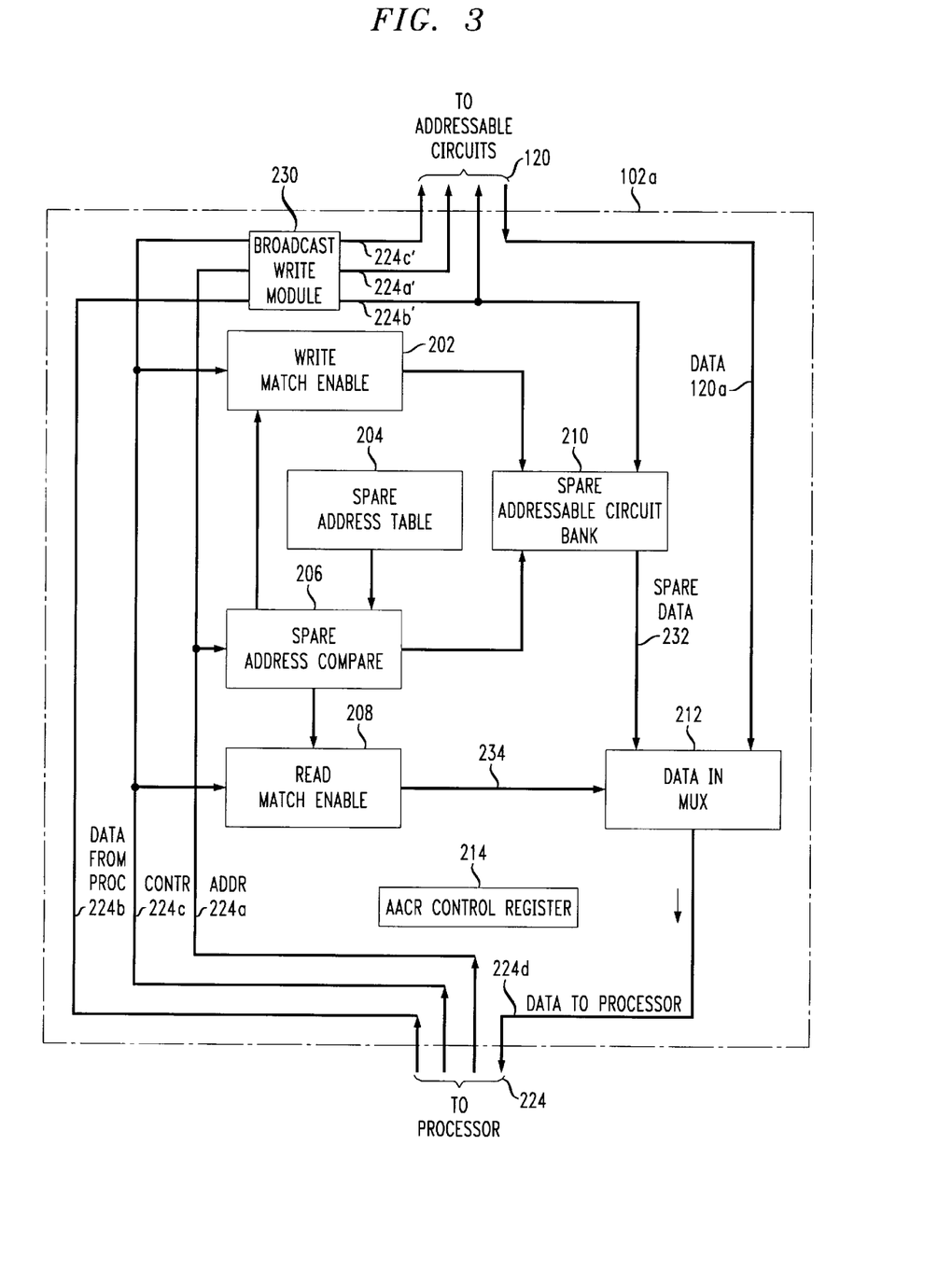
FIG. 3 is a block diagram of another embodiment of the adaptive addressable circuit redundancy module shown in FIG. 1.

In another embodiment of the present invention, a broadcast write feature is included in the AACR module 102, as shown in FIG. 3. Implementation of the broadcast write concept decreases memory test time.

In FIG. 3, a broadcast write module 230 is connected to the address, data and control busses 224a–224c to write to all or a substantial portion of the memory in memory blocks 110 substantially simultaneously. The value of the data broadcast by the broadcast write module 230 is set in the AACR control register 214, which also enables the broadcast write module 230.

In an initial test phase of the disclosed embodiment, the broadcast write module 230 forces all of the block based select signals cs on the control bus 224c to an active or enabled state. Then, the broadcast write module 230 broadcasts the same data pattern to all enabled memory locations or blocks substantially simultaneously.

The broadcast write module 230 includes appropriate drivers to suitably overcome the substantial capacitance and drain appropriate to the number of memory locations accompanying the substantially simultaneous write.

The broadcast write module 230 may be partitioned into smaller sub-broadcast write modules (not shown) which each broadcast the data in the AACR control register 214 to a correspondingly smaller group or block of memory. In this case, each broadcast write module 230 is separately enabled by respective bits in a broadcast control register 414.

The enable signal 234 from the read match enable 208 to the data MUX 212 preferably arrives in advance of the data on the data bus 120a and/or spare data bus 232, so that the propagation delay of the data MUX 212 is the only speed penalty in this embodiment of the present invention. An alternate scheme possibly having a lower speed penalty intercepts and jams appropriate chip enable signals cr in the control bus 224c to the defective addressable circuits, e.g., memory blocks 110, and simply allows the spare addressable circuit bank 210 to drive the data bus 224d directly (instead of through the data MUX 212 as shown in FIG. 3) for the duration of the access to the defective memory word. Thus, the data MUX 212 and its associated propagation delay may be reduced if desired.

The broadcast write concept may be used to significantly reduce memory test time, e.g., by almost 50%. The memory in memory blocks 110 can be written to in one or just a few broadcast write operations by the broadcast write module 230, then the processor 104 can continue the memory test by individually reading each memory word during its test phase. This block write and individual read cycle can be repeated any number of times to accomplish the memory test phase. Moreover, for each block write a different data pattern may be written to the memory blocks 110 in broadcast fashion.

Figure 4:
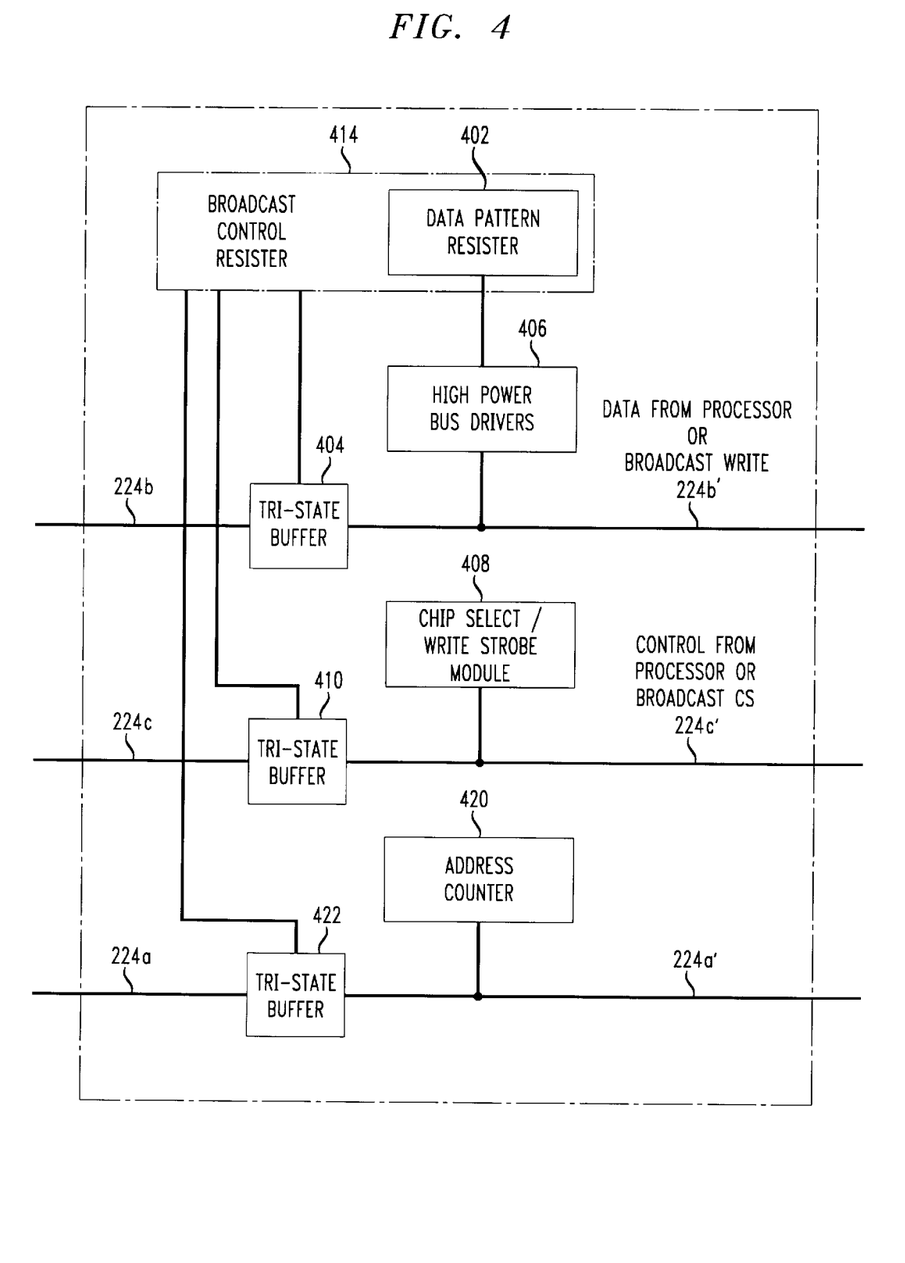
FIG. 4 is a detailed block diagram of the broadcast write module of FIG. 3.

FIG. 4 shows the broadcast write module 230 in more detail.

In FIG. 4, the broadcast write module 230 includes the broadcast control register 414 as described in the earlier embodiments but with additional storage of a data pattern register 402. The data pattern register corresponds to the data to be written in broadcast fashion to portions or all of the memory blocks 110.

High power bus drivers 406 drive the high capacitance caused by a plurality of memory locations being accessed substantially simultaneously. During the broadcast write operation, the data bus 224*b* and control bus 224*c* from the processor 104 are tri-stated by tri-state buffers 404 and 410, respectively.

Some or all memory blocks 110 are accessed substantially simultaneously by appropriate control signals from a chip select/write strobe module 408, which controls the chip selects cs and write wr signals to the memory blocks 110.

Ideally, all corresponding memory locations in each accessed memory block 110 will be accessed substantially simultaneously during one broadcast write cycle. However, in an alternative embodiment, an address counter 420 cycles through appropriate addresses in at least two or more accessed memory blocks 110 substantially simultaneously. In this embodiment, a tri-state buffer 422 isolates the address signals from the processor 104 from interfering with the broadcast addresses from address counter 420.

The ability to enable and/or disable the memory redundancy, the spare address table 204, and/or the spare addressable circuit bank 210 allows the AACR module 102 to be checked on defect-free parts during manufacture to ensure the viability of adaptive field level redundancy. This approach also gives one the freedom to override or append the current self-test results.

Depending upon the amount of spare memory in the spare addressable circuit bank 210, the adaptive addressable circuit redundancy in accordance with the present invention may also be used to provide a software patch to replace portions of ROM in the integrated circuit device with updated code or a trap code in ROM during software debug.

While described with respect to embedded memory, the present invention is equally applicable to the adaptive test, analysis and replacement of any addressable circuitry in an integrated circuit with available spare addressable circuits in the integrated circuit. For instance, the adaptive memory redundancy methods and apparatus of the present invention are equally applicable to embedded ROM, and even to external memory associated with the on-chip processor 104.

Moreover, while the adaptive memory redundancy method and apparatus disclosed herein is preferred over conventional techniques such as laser etching of fuses to remove defective memory, the present invention may be implemented together with conventional redundancy techniques such as laser etching of fuses to provide more flexible and improved redundancy techniques and apparatus.

The adaptive redundancy method and apparatus significantly increase device yield and overall manufacturability of integrated circuit devices having a large chip size and/or a high memory density.

While the invention has been described with reference to the exemplary embodiments thereof, those skilled in the art will be able to make various modifications to the described embodiments of the invention without departing from the true spirit and scope of the invention.

What is claimed is:

1. An adaptive addressable circuit redundancy apparatus comprising, on an integrated circuit:
    a processor;
    a plurality of addressable circuits;
    at least one spare addressable circuit;
    an adaptive addressable circuit redundancy module intercepting a data path between said processor and said plurality of addressable circuits, said adaptive addressable circuit redundancy module comprising an address compare circuit adapted to compare an address from said processor with assigned addresses of said at least one spare addressable circuit and to redirect access by said processor to a matching spare element location assigned one of said at least one spare addressable circuit; and
    a spare address table adapted to contain said assigned addresses for said at least one spare addressable circuit.

2. The adaptive addressable circuit redundancy apparatus according to claim 1, wherein:
    said plurality of addressable circuits and said at least one spare addressable circuit are memory.

3. The adaptive addressable circuit redundancy apparatus according to claim 2, wherein:
    said memory is random access memory.

4. The adaptive addressable circuit redundancy apparatus according to claim 2, wherein:
    said memory is read only memory.

5. The adaptive addressable circuit redundancy apparatus according to claim 1, wherein:
    said processor, said plurality of addressable circuits, said at least one spare addressable circuit, and said adaptive addressable circuit redundancy module are implemented in a single integrated circuit.

6. The adaptive addressable circuit redundancy apparatus according to claim 1, further comprising:
    at least eight spare addressable circuits.

7. An adaptive addressable circuit redundancy apparatus comprising, on an integrated circuit:
    a processor;
    a plurality of addressable circuits;
    at least one spare addressable circuit;
    an adaptive addressable circuit redundancy module intercepting a data path between said processor and said plurality of addressable circuits, said adaptive addressable circuit redundancy module comprising an address compare circuit adapted to compare an address from said processor with assigned addresses of said at least one spare addressable circuit and to redirect access by said processor to a matching spare element location assigned one of said at least one spare addressable circuit; and
    wherein said plurality of addressable circuits and said at least one spare addressable circuit are a plurality of registers.

8. A method of redirecting access by an on-chip processor from a defective addressable circuit to a spare addressable circuit, said method comprising:
    providing said on-chip processor and a plurality of addressable circuits on an integrated circuit;
    providing at least one spare addressable circuit on said integrated circuit;

testing, with said on-chip processor, an operational condition of said plurality of addressable circuits; and reassigning, to said at least one spare addressable circuit, an address of at least one of said plurality of addressable circuits not meeting said operational condition.

9. The method of redirecting access by an on-chip processor from a defective addressable circuit to a spare addressable circuit according to claim 8, further comprising:

providing a program on said integrated circuit to control said on-chip processor in performance of said steps of testing and reassigning.

10. The method of redirecting access by an on-chip processor from a defective addressable circuit to a spare addressable circuit according to claim 8, wherein:

said step of reassigning is performed prior to packaging of said integrated circuit.

11. The method of redirecting access by an on-chip processor from a defective addressable circuit to a spare addressable circuit according to claim 8, wherein:

said step of reassigning is performed after packaging of said integrated circuit.

12. The method of redirecting access by an on-chip processor from a defective addressable circuit to a spare addressable circuit according to claim 8, further comprising:

maintaining in said integrated circuit a spare usage log with respect to said reassignments performed by said step of reassigning.

13. The method of redirecting access by an on-chip processor from a defective addressable circuit to a spare addressable circuit according to claim 12, further comprising:

uploading said spare usage log to a processor external to said integrated circuit.

14. The method of redirecting access by an on-chip processor from a defective addressable circuit to a spare addressable circuit according to claim 8, wherein:

said plurality of addressable circuits and said at least one spare addressable circuit are memory.

15. The method of redirecting access by an on-chip processor from a defective addressable circuit to a spare addressable circuit according to claim 14, wherein:

said memory is random access memory.

16. The method of redirecting access by an on-chip processor from a defective addressable circuit to a spare addressable circuit according to claim 14, wherein:

said memory is read only memory.

17. The method of redirecting access by an on-chip processor from a defective addressable circuit to a spare addressable circuit according to claim 14, wherein:

said memory is a plurality of registers.

18. Apparatus for redirecting access by an on-chip processor from a defective addressable circuit to a spare addressable circuit, said method comprising:

means for providing said on-chip processor and a plurality of addressable circuits on an integrated circuit;

means for providing at least one spare addressable circuit on said integrated circuit;

means for testing, with said on-chip processor, an operational condition of said plurality of addressable circuits; and means for reassigning, to said at least one spare addressable circuit, an address of at least one of said plurality of addressable circuits not meeting said operational condition.

19. The apparatus for redirecting access by an on-chip processor from a defective addressable circuit to a spare addressable circuit according to claim 18, further comprising:

means for providing a program on said integrated circuit to control said on-chip processor in performance of said steps of testing and reassigning.

20. The apparatus for redirecting access by an on-chip processor from a defective addressable circuit to a spare addressable circuit according to claim 18, wherein:

said means for reassigning is adapted to reassign said address prior to packaging of said integrated circuit.

21. The apparatus for redirecting access by an on-chip processor from a defective addressable circuit to a spare addressable circuit according to claim 18, wherein:

means for reassigning is adapted to reassign said address after packaging of said integrated circuit.

22. The apparatus for redirecting access by an on-chip processor from a defective addressable circuit to a spare addressable circuit according to claim 18, further comprising:

means for maintaining in said integrated circuit a spare usage log with respect to said reassigned addresses.

23. The apparatus for redirecting access by an on-chip processor from a defective addressable circuit to a spare addressable circuit according to claim 22, further comprising:

means for uploading said spare usage log to a processor external to said integrated circuit.

24. The apparatus for redirecting access by an on-chip processor from a defective addressable circuit to a spare addressable circuit according to claim 18, wherein:

said plurality of addressable circuits and said at least one spare addressable circuit are memory.

25. The apparatus for redirecting access by an on-chip processor from a defective addressable circuit to a spare addressable circuit according to claim 24, wherein:

said memory is random access memory.

26. The apparatus for redirecting access by an on-chip processor from a defective addressable circuit to a spare addressable circuit according to claim 24, wherein:

said memory is read only memory.

27. The apparatus for redirecting access by an on-chip processor from a defective addressable circuit to a spare addressable circuit according to claim 24, wherein:

said memory is a plurality of registers.

28. A method of redirecting access by an on-chip processor from a defective addressable circuit to a spare addressable circuit, said method comprising:

providing said on-chip processor and a plurality of addressable circuits on an integrated circuit;

providing at least one spare addressable circuit on said integrated circuit;

testing, initiated by said on-chip processor, an operational condition of said plurality of addressable circuits;

reassigning, to said at least one spare addressable circuit, an address of at least one of said plurality of addressable circuits not meeting said operational condition; and storing said address in a spare address table on said integrated circuit.

29. The method of redirecting access by an on-chip processor from a defective addressable circuit to a spare addressable circuit according to claim 28, further comprising:

providing a program on said integrated circuit to control said on-chip processor in performance of said steps of testing and reassigning.

30. The method of redirecting access by an on-chip processor from a defective addressable circuit to a spare addressable circuit according to claim 28, wherein:

said step of reassigning is performed prior to packaging of said integrated circuit.

31. The method of redirecting access by an on-chip processor from a defective addressable circuit to a spare addressable circuit according to claim 28, wherein:

said step of reassigning is performed after packaging of said integrated circuit.

32. The method of redirecting access by an on-chip processor from a defective addressable circuit to a spare addressable circuit according to claim 28, wherein:

said plurality of addressable circuits and said at least one spare addressable circuit are memory.

33. The method of redirecting access by an on-chip processor from a defective addressable circuit to a spare addressable circuit according to claim 32, wherein:

said memory is random access memory.

34. The method of redirecting access by an on-chip processor from a defective addressable circuit to a spare addressable circuit according to claim 32, wherein:

said memory is read only memory.

35. The method of redirecting access by an on-chip processor from a defective addressable circuit to a spare addressable circuit according to claim 32, wherein:

said memory is a plurality of registers.

36. Apparatus for redirecting access by an on-chip processor from a defective addressable circuit to a spare addressable circuit, said method comprising:

means for providing an on-chip processor and a plurality of addressable circuits on an integrated circuit;

means for providing at least one spare addressable circuit on said integrated circuit;

means for testing, initiated by said on-chip processor, an operational condition of said plurality of addressable circuits;

means for reassigning, to said at least one spare addressable circuit, an address of at least one of said plurality of addressable circuits not meeting said operational condition; and means for storing said address in a spare address table on said integrated circuit.

37. The apparatus for redirecting access by an on-chip processor from a defective addressable circuit to a spare addressable circuit according to claim 36, further comprising:

means for providing a program on said integrated circuit to control said on-chip processor in performance of said steps of testing and reassigning.

38. The apparatus for redirecting access by an on-chip processor from a defective addressable circuit to a spare addressable circuit according to claim 36, wherein:

said means for reassigning is adapted to reassign said address prior to packaging of said integrated circuit.

39. The apparatus for redirecting access by an on-chip processor from a defective addressable circuit to a spare addressable circuit according to claim 36, wherein:

means for reassigning is adapted to reassign said address after packaging of said integrated circuit.

40. The apparatus for redirecting access by an on-chip processor from a defective addressable circuit to a spare addressable circuit according to claim 36, wherein:

said plurality of addressable circuits and said at least one spare addressable circuit are memory.

41. The apparatus for redirecting access by an on-chip processor from a defective addressable circuit to a spare addressable circuit according to claim 40, wherein:

said memory is random access memory.

42. The apparatus for redirecting access by an on-chip processor from a defective addressable circuit to a spare addressable circuit according to claim 40, wherein:

said memory is read only memory.

43. The apparatus for redirecting access by an on-chip processor from a defective addressable circuit to a spare addressable circuit according to claim 40, wherein:

said memory is a plurality of registers.

* * * * *